(12) United States Patent
Citarella et al.

(10) Patent No.: US 11,024,755 B2
(45) Date of Patent: Jun. 1, 2021

(54) METHOD FOR PRODUCING A SOLAR CELL, SOLAR CELL PRODUCED BY THIS METHOD AND SUBSTRATE CARRIER

(71) Applicant: MEYER BURGER (GERMANY) GMBH, Hohenstein-Ernstthal (DE)

(72) Inventors: Giuseppe Citarella, Chemnitz (DE); Hans-Peter Sperlich, Dresden (DE); Gunnar Koehler, Ehrenfriedersdorf (DE); Frank Wuensch, Berlin (DE); Detlef Sontag, Waldenburg (DE); Heiko Mehlich, Chemnitz (DE); Marcel Koenig, Chemnitz (DE); Pierre Papet, Hauterive (CH)

(73) Assignee: Meyer Burger (Germany) GmbH, Hohenstein-Ernstthal (DE)

( * ) Notice: Subject to any disclaimer, the term of this patent is extended or adjusted under 35 U.S.C. 154(b) by 73 days.

(21) Appl. No.: 16/092,850

(22) PCT Filed: Apr. 7, 2017

(86) PCT No.: PCT/IB2017/052013
§ 371 (c)(1),
(2) Date: Jan. 31, 2019

(87) PCT Pub. No.: WO2017/178941
PCT Pub. Date: Oct. 19, 2017

(65) Prior Publication Data
US 2019/0288130 A1   Sep. 19, 2019

(30) Foreign Application Priority Data

Apr. 11, 2016 (DE) .................. 10 2016 106 563.3

(51) Int. Cl.
*H01L 31/18* (2006.01)
*H01L 31/0747* (2012.01)
(Continued)

(52) U.S. Cl.
CPC .............. *H01L 31/02168* (2013.01); *H01L 31/022425* (2013.01); *H01L 31/022433* (2013.01);
(Continued)

(58) Field of Classification Search
CPC ............ H01L 31/035209; H01L 31/18; H01L 31/1804; H01L 31/062; Y02E 10/547; Y02P 70/521
See application file for complete search history.

(56) References Cited

U.S. PATENT DOCUMENTS

| | | | |
|---|---|---|---|
| 9,484,485 B2 | 11/2016 | Adachi et al. | |
| 2004/0189311 A1* | 9/2004 | Glezer | C12Q 1/001 324/444 |

(Continued)

FOREIGN PATENT DOCUMENTS

| | | |
|---|---|---|
| DE | 102011006833 A1 | 10/2012 |
| EP | 2662900 A1 | 11/2013 |

(Continued)

*Primary Examiner* — Brian Turner
(74) *Attorney, Agent, or Firm* — Laurence A. Greenberg; Werner H. Stemer; Ralph E. Locher (57) ABSTRACT

A solar cell with a heterojunction is produced. A first amorphous nano- and/or microcrystalline semiconductor layer is formed on the front face of a crystalline semiconductor substrate to form front face emitter or a front face surface field layer. A second such layer is formed on the rear face of the substrate to form a rear face surface field layer or a rear face emitter. Electrically conductive, transparent front face and rear face electrode layers and a frontal metallic contact layer grid structure are formed. Surface selective frontal PECVD deposition forms an electrically non-conductive, transparent dielectric front face cover layer and with such a thickness to form a closed layer directly on deposition, without additional heat and/or chemical treatment, only on the areas surrounding the frontal contact layer grid (Continued)

structure but not on the frontal contact layer grid structure. Finally, a rear face metallization is formed.

16 Claims, 3 Drawing Sheets

(51) Int. Cl.
| | |
|---|---|
| H01L 31/0352 | (2006.01) |
| H01L 31/068 | (2012.01) |
| H01L 31/105 | (2006.01) |
| H01L 31/0216 | (2014.01) |
| H01L 31/0224 | (2006.01) |
| H01L 31/0376 | (2006.01) |
| H01L 31/20 | (2006.01) |
| C23C 16/34 | (2006.01) |
| C23C 16/40 | (2006.01) |

(52) U.S. Cl.
CPC ......... *H01L 31/022466* (2013.01); *H01L 31/03762* (2013.01); *H01L 31/0747* (2013.01); *H01L 31/1884* (2013.01); *H01L 31/202* (2013.01); *C23C 16/345* (2013.01); *C23C 16/402* (2013.01); *C23C 16/407* (2013.01); *Y02E 10/50* (2013.01)

(56) References Cited

U.S. PATENT DOCUMENTS

| | | | |
|---|---|---|---|
| 2009/0233426 A1* | 9/2009 | Poplavskyy | H01L 21/02579 438/502 |
| 2010/0304521 A1* | 12/2010 | Seutter | H01L 31/03529 438/71 |
| 2012/0125397 A1* | 5/2012 | Okada | H01L 31/068 136/244 |
| 2014/0124014 A1* | 5/2014 | Morad | H01L 31/042 136/246 |
| 2014/0261666 A1* | 9/2014 | Stewart | H01L 31/022425 136/256 |
| 2015/0349160 A1* | 12/2015 | Cheng | H01L 31/035218 257/21 |
| 2016/0126399 A1* | 5/2016 | Hino | H01L 31/022425 136/256 |
| 2016/0181466 A1 | 6/2016 | Adachi et al. | |
| 2016/0247960 A1 | 8/2016 | Bettinelli | |
| 2016/0308079 A1 | 10/2016 | Adachi et al. | |

FOREIGN PATENT DOCUMENTS

| | | |
|---|---|---|
| FR | 3011982 A1 | 4/2015 |
| JP | 2000058885 A | 2/2000 |
| JP | 5759639 B2 | 8/2015 |
| WO | 2014192739 A1 | 12/2014 |
| WO | 2015064634 A1 | 5/2015 |

\* cited by examiner

METHOD FOR PRODUCING A SOLAR CELL, SOLAR CELL PRODUCED BY THIS METHOD AND SUBSTRATE CARRIER

BACKGROUND OF THE INVENTION

Field of the Invention

The present invention relates to a method for producing a solar cell with a heterojunction, a front face provided for an incidence of light and a rear face situated opposite the front face, wherein the method comprises the following steps: providing a crystalline semiconductor substrate of a first conductivity type; forming at least one amorphous, nano and/or micro crystalline semiconductor layer or layer sequence on a frontal surface of the semiconductor substrate, either by forming a front face emitter of a second conductivity type opposed to the first conductivity type or by forming a front face surface field layer of the first conductivity type; forming at least a second amorphous, nano and/or micro crystalline semiconductor layer or layer sequence on a rearward surface of the semiconductor substrate, either by forming a rear face surface field layer of the first conductivity type or by forming a rear face emitter of the second conductivity type; forming at least one electrically conductive, transparent front face electrode layer on the front face emitter or the front face surface field layer and forming at least one electrically conductive, transparent rear face electrode layer on the rear face surface field layer or the rear face emitter; forming of a frontal metallic contact layer grid structure for electrically contacting the front face emitter or the front face surface field layer; frontal PECVD-deposition of an electrically non-conductive, transparent dielectric front face cover layer after forming the frontal contact layer grid structure; and forming a rear face metallization on the rear face electrode layer. The invention furthermore relates to a solar cell being produced with the method as well as a substrate carrier with a plate-shaped support grid, which comprises at least one hollow support nest being surrounded by a nest frame for receiving a laminar semiconductor substrate each.

In order to form a contact layer grid structure, such as a silver finger structure as a collector electrode, on a transparent dielectric front and/or rear face cover layer, such as a transparent, conductive oxide layer (TCO layer) of a solar cell, in the prior art, the silver fingers are typically applied using an electroplating technology with a mask which is afterwards removed again. The masking material as well as the steps involved with its application and removal are cost-intensive and can lead to disadvantageous influences of the solar cell characteristics.

Moreover, a problem of solar cells with exposed TCO coating is that they can have a strong loss of efficiency when exposed to moisture, particularly with increased temperature. The (electro)chemical disintegration or corrosion of the TCO layer occuring under the influence of humidity leads to an increase of the serial resistance ($R_S$) and a resulting degradation of the fill factor (FF) of the solar cell. The conversion efficiency of the solar cell (ETA) drops dramatically. So-called bifacial solar cells with TCO being exposed on both sides are particularly prone to such signs of corrosion. However, the invention is also applicable for solar cells with monofacial TCO coating.

In order to protect the TCO surface from corrosion, an isolating layer such as a silicon oxide, silicon nitride or silicon oxynitride layer, can be applied to the TCO. However, where the TCO layer is to be electrically contacted by the contact layer grid structure or the contact fingers, it needs to be removed again or must not be deposited in these areas in the first place. For this, a masking technology is typically used or the dielectric layer being deposited over the metallization is locally opened by means of laser ablation or masked etching in order to imprint metal structures or generate them by plating. This, however, has the disadvantage that by opening the hermetical dielectric layer, potential leak paths are established for moisture to ingress in later.

In order to form an isolating layer on the TCO and still be able to suitably electrically contact the TCO in a technologically easy way, the document EP 2 662 900 A1 proposes to forgo the masking and to form the contact layer grid structure of a first electrically conductive layer from a material with a low melting point and a second electrically conductive layer. For this, the first electrically conductive layer with the material with the low melting point is applied to a transparent dielectric front face cover layer (TCO layer), on it an isolating layer is deposited over the entire surface, the first electrically conductive layer is melted by heating and thus the isolating layer is burst open above the first conductive layer. Due to the bursting open, cracks develop in the isolating layer into which the second conductive layer deposited at that can enter and establish an electrical contact to the first electrically conductive layer and thus the TCO layer.

With this technology, one is bound to form the first conductive layer only on the subsequent contact points and also heat it only there. That means, one also needs at least one structured deposition or structuring here, furthermore faces the problem of how the local heating is to be carried out and has to try to keep the temperature load of the solar cells as low as possible during this heating step, in order not to influence the solar cell characteristic in a negative way.

BRIEF SUMMARY OF THE INVENTION

It is therefore the object of the present invention to provide a method for producing a solar cell, which allows for both the formation of a suitable protection against moisture for the TCO layer(s) of the solar cell in a truly easy and efficient way and an easy, high quality electrical contacting of the solar cell which does not influence the solar cell characteristics in a negative way. Furthermore, a solar cell producible based on the method is to be provided. Furthermore, the substrate carrier of the above-mentioned type is to be formed in such a way that it is suitable for this method.

On the one hand, this object is solved by a method of the above-mentioned type, whereby a surface selective PECVD deposition is used for the deposition of the front face cover layer and the front face cover layer is deposited with such a thickness that the front face cover layer forms a closed layer directly after its layer deposition, without additional heat and/or chemical treatment only on the areas surrounding the frontal contact layer grid structure, but not on the frontal contact layer grid structure.

With a PECVD deposition, it has surprisingly emerged that the front face cover layer initially only deposits on the electrically conductive, transparent front face electrode layer and not or only minimally on the contact layer grid structure, that is surface selective. Thus, the front face cover layer can be deposited even after forming the contact layer grid structure, without the need to subsequently etch the front face cover layer from the contact layer grid structure. Thus, a full metallization of the solar cell can be carried out and the moisture blocking, electrically non-conductive, transparent dielectric front face cover layer, which seals the front face electrode layer, can afterwards be deposited onto the entire solar cell.

Such a surface selectivity with the deposition is not achievable with other layer deposition methods, such as the atomic layer deposition (ALD), the sputtering or with vapor deposition methods.

With the present invention, SiO/N layer(s) can thereby for example be considered as a front face cover layer, which are usually already used as antireflection and passivation layers with solar cells. Moisture affine $AlO_x$ layers, on the other hand, are less suitable as a front face cover layer, but can, for example, be advantageously used as an upper coating layer of a front face cover layer consisting of a silicon oxide and an aluminium oxide for the absorption of moisture and thus as a barrier layer against moisture towards the underlying silicon oxide layer.

The PECVD method, which is used for forming the front face cover layer according to the invention, furthermore has the advantage that it functions in the low temperature range, that is with temperatures≤200° C., whereby the method according to the invention is particularly suitable for the usage with temperature-sensitive solar cells, such as heterojunction solar cells with amorphous, nano and/or microcrystalline silicon surface passivation layers.

According to an embodiment of the present invention, such a moisture barrier can also be provided on the solar cell rear face. Thereby, the formation of the back side metallization comprises the following steps: forming a rearward metallic contact layer grid structure for electrically contacting the rear emitter or the rear face surface field layer; rearward PECVD deposition of an electrically non-conductive, transparent dielectric rear face cover layer after forming the rearward contact layer grid structure; wherein a surface selective PECVD deposition is used for the deposition of the rear face cover layer and the rear face cover layer is deposited with such a thickness that the rear face cover layer forms a closed layer directly after its layer deposition, without additional heat and/or chemical treatment only on areas surrounding the rearward contact layer grid structure, but not on the rearward contact layer grid structure.

The method according to the invention is thus also useable with bifacial solar cells, such as bifacial heterojunction rear face emitter solar cells.

The frontal or rearward contact layer grid structure can initially be formed as a seed layer structure, which is subsequently reinforced. In a variant of the method according to the invention it is therefore provided that at least one frontal metallic contact thickness strengthening layer is galvanically deposited on the frontal contact layer grid structure using the material of the front face cover layer as a galvanic masking layer without previous structuring and/or without at least partial removal of the front face cover layer, and/or at least one rearward metallic contact thickness strengthening layer is galvanically deposited on the rearward contact layer grid structure using the material of the rear face cover layer as a galvanic masking layer without previous structuring and/or at least partial removal of the rear face cover layer.

Thereby, the frontal and/or the rearward contact layer grid structure is initially applied, for example printed and tempered, to the surface of the electrically conductive, transparent frontal and/or rearward electrode layer as a seed layer or seed structure as a very thin metallization structure, for example in the form of fingers or busbars. As a material for the seed structure a paste, such as a silver paste, can for example be used.

After applying the seed structure, the front and/or the rear face cover layer is deposited onto the respective solar cell side(s) by means of PECVD deposition. As described above, the seed structure is not or not fully coated with this PECVD deposition. Thereby, the seed structure can for example be galvanically reinforced after deposition of the front and/or the rear face cover layer without the need to remove it on the seed structure. For galvanic reinforcement, the LIP (Light Induced Plating) method can for example be used. Silver as well as copper can be considered as a material for the contact thickness strengthening layer. With this embodiment of the method according to the invention, the preferably but not exclusively galvanically producible, metallic contact thickness strengthening layer adheres very well to the seed structure and increases its electric conductivity.

This variant of the method according to the invention has the advantage that no SiON layer needs to be additionally deposited as a galvanic mask, since the front and/or rear face cover layer surrounding the seed structure, lying on the electrically conductive, transparent front and/or rear face electrode layer, already takes on the masking function.

With this procedure one can furthermore achieve a better cell efficiency. Thus, there is the possibility to thin the electrically conductive, transparent front and/or rear face electrode layer, which is for example an ITO layer, or to replace a major part of the thickness of the front and/or the rear face electrode layer by the front and/or rear face cover layer, that is a SiON layer. Thereby, the anti-reflective layer of the solar cell becomes more transparent. The optics of the solar cell can thereby be considerably improved both in the UV range, in which the absorption is reduced by means of a thinner TCO layer, as well as in the infrared range. When using ITO (indium tin oxide) as a front and/or rear face electrode layer, one furthermore saves indium.

With this variant of the method according to the invention, the silver paste used for producing the contact layer grid structure can furthermore be saved while still achieving a very good electric conductivity of the contact fingers of the contact layer grid structure. This method is suitable for module interconnections with and without busbars, without risking additional efficiency losses. Despite the overcoating used according to the invention, a good contactability and/or solderability of the contact layer grid structure is given.

According to this, the front and/or the rear face cover layer of the present invention are multifunctional. They can be used as anti-reflection or reflection protection layer(s), corrosion protection or sealing layer(s) and/or as mask(s) for a galvanic reinforcement of contact seed structures.

In expedient embodiments of the present invention, the frontal metallic contact layer grid structure and/or the rearward metallic contact layer grid structure is/are strengthened by tempering prior to the deposition of the front face cover layer and/or prior to the deposition of the rear face cover layer.

It is particularly effective for the formation of the front face cover layer and the rear face cover layer to take place immediately one after another in one treatment process in the same coating device.

A microwave-based PECVD deposition for producing the transparent dielectric front face cover layer and/or the transparent dielectric rear face cover layer has proven to be particularly gentle. With the present invention, the PECVD deposition for producing the transparent dielectric front face cover layer and/or the transparent dielectric rear face cover layer can alternatively be an HF (high frequency) PECVD, a VHF (ultra high frequency) PECVD or a PECVD using an ETP (Expanding Thermal Plasma) source. Instead of a PECVD, a hotwire CVD can generally also be used for producing the transparent dielectric front face cover layer and/or the transparent dielectric rear face cover layer.

At least one $SiO_x$—, $SiN_x$—, $SiO_xN_y$—, $AlO_x$—, $AlN_x$—, $TiO_2$ layer, at least one electrically conductive oxide or a layer or layer sequence consisting of a combination of at least two of the aforementioned materials is preferably used for depositing the front face cover layer and/or the rear face cover layer.

Particularly preferably, at least one $SiO_x$ layer is used for depositing the front face cover layer and/or at least one $SiN_x$ layer is used for depositing the rear face cover layer. Thus, a $SiO_2$ layer with a thickness between 70 and 100 nm as a front face cover layer on the solar cell front side and/or an $SiN_x$ layer with a thickness between 80 and 120 nm as a rear face cover layer on the solar cell rear face can for example be applied.

In an optional embodiment of the method according to the invention, the front face cover layer and/or the rear face cover layer is/are at least partially doped with carbon. For instance, adding tetramethylsilane to the used chemical silane can take place. By doping with carbon, the wet etch rate or a chemical vulnerability of the front face cover layer and/or the rear face over layer can for example be reduced.

With the method according to the invention, the front face cover layer and/or the rear face cover layer is/are preferably deposited at temperatures as low as possible, that is in a temperature range between 50° C. and 250° C., particularly preferable at temperatures≤200° C. The additional short-term temperature increase, for example between 150° C. to 200° C. for two to three minutes, during the PECVD enhances the conductivity of the contact fingers and their contacting on the TCO. Hereby, there is a slight increase of the fill factor FF of the solar cell, for example of +0.5%, and the conversion efficiency ETA of the solar cell, for example of +0.2%.

For forming the frontal and/or the rearward contact layer grid structure and the at least one frontal and/or the at least one rearward contact thickness strengthening layer, at least one electrically conductive oxide, at least one metal, at least one metallic alloy or a combination of at least two of the aforementioned materials can preferably be used.

For forming the frontal and/or the rearward contact layer grid structure and the at least one frontal and/or the at least one rearward contact thickness strengthening layer, a material is preferably chosen with the method according to the invention, which consists predominantly, that is more than 50%, of silver or copper.

It is particularly appropriate when the frontal and/or the rearward contact layer grid structure is/are printed as a finger structure using a paste.

With the method according to the invention, transparent, electrically conductive oxide, that is a TCO layer, such as an ITO layer, is preferably used for forming the front face electrode layer and/or the rear face electrode layer.

In order to achieve a particularly effective cell protection from corrosion, it is advisable for the formation of the front face cover layer to be completely carried out over the entire front face, including the coverage of the edges of the semiconductor substrate, and/or the formation of the rear face cover layer completely over the entire rear face, including the coverage of the edges of the semiconductor substrate. The thus achievable double-sided, complete, full hermetic sealing of the already metalized TCO surfaces of the solar cell including the wafer edge effectively prevents an attack of moisture on the TCO, both on module level as well as on cell level. The result is no or only a very low TCO degradation.

Such a cover encasing the edge of the semiconductor substrate can only be achieved when a suitable substrate carrier is used. The present invention therefore suggests a substrate carrier with a plate shaped carrier grid, which comprises at least one hollow carrier nest enclosed by a nest frame for receiving a laminar semiconductor substrate each, wherein retaining hooks protrude into the carrier nest from all sides of the nest frame and on each retaining hook at least one retaining pin is provided, which is aligned parallelly to a surface of the semiconductor substrate to be received.

The carrier grid preferably comprises at least two adjacent carrier nests separated by a frame beam of the nest frame, and the retaining hooks are provided on retaining brackets fixed on the frame beam and protruding into one of the carrier nests each on both sides of the frame beam.

BRIEF DESCRIPTION OF THE SEVERAL VIEWS OF THE DRAWING

Preferred embodiments of the present invention, their process or structure, function and advantages are explained in more detail in the following figures, wherein FIGS. 1 to 3 schematically show a process sequence according to the invention.

DESCRIPTION OF THE INVENTION

Figure 1:
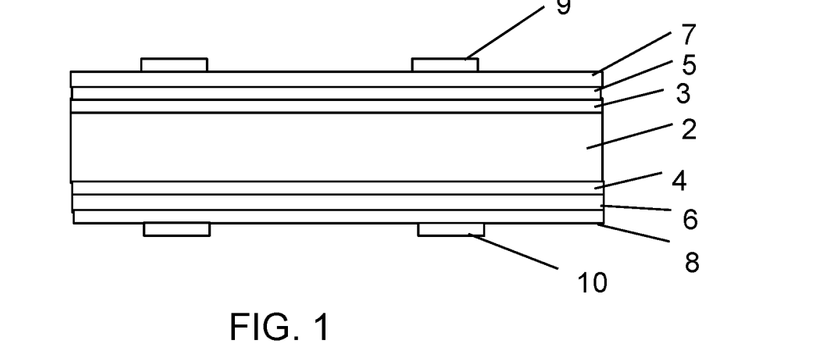

As can be seen from FIG. 1, at least one semiconductor substrate 2 is initially provided in the method according to the invention. The semiconductor substrate 2 is of a first conductivity type, thus can be n or p-doped. Typically, but not necessarily, the semiconductor substrate 2 is formed of n-doped silicon.

In this embodiment shown in FIG. 1, intrinsic amorphous semiconductor layers 3, 4, in the shown example i-a-Si layers of a few nanometers, are provided on both sides of the semiconductor substrate 2. Instead of the or in addition to the intrinsic amorphous semiconductor layers 3, 4, intrinsic nano and/or microcrystalline semiconductor layers, for example of silicon, can also be used in other embodiments of the present invention.

Electrically conductive amorphous doped semiconductor layers 5, 6 are respectively provided on the intrinsic amorphous semiconductor layers 3, 4. Instead of the or in addition to the amorphous doped semiconductor layers 5, 6, nano and/or microcrystalline doped semiconductor layers, for example of silicon, can also be used in other embodiments of the present invention. In the embodiment shown in FIG. 1, a p-doped amorphous silicon layer 5, which thus comprises a conductivity type contrary to the semiconductor substrate 2, is provided on the intrinsic amorphous silicon layer 3 located on the semiconductor front face by forming a front face emitter. In the embodiment shown in FIG. 1, an n-doped amorphous silicon layer 6, which thus comprises the same conductivity type as the semiconductor substrate 2, is furthermore provided on the intrinsic amorphous silicon layer 5 located on the semiconductor rear face by forming a rear face surface field layer.

In other embodiments of the present invention not shown here, a front face surface field layer on the front face of the semiconductor substrate 2 and a rear face emitter on the rear face of the semiconductor substrate 2 can be provided.

In the example of FIG. 1, an electrically conductive, transparent front face electrode layer 7, which is a TCO layer, such as an ITO layer, in the shown embodiment, is provided on the front face emitter. Furthermore, an electrically conductive, transparent rear face electrode layer 8, which is a TCO layer, such as an ITO layer, is also provided on the rear face surface field layer.

Moreover, a frontal metallic contact layer grid structure 9 for electrically contacting the front face emitter on the front face electrode layer 7 and a rearward metallic contact layer grid structure 10 for contacting the rear face surface field layer on the face side electrode layer 8 is provided. In the shown embodiment, the frontal and the rearward metallic contact layer grid structure 9, 10 are thin, printed, finger-shaped silver seed structures.

Figure 2:
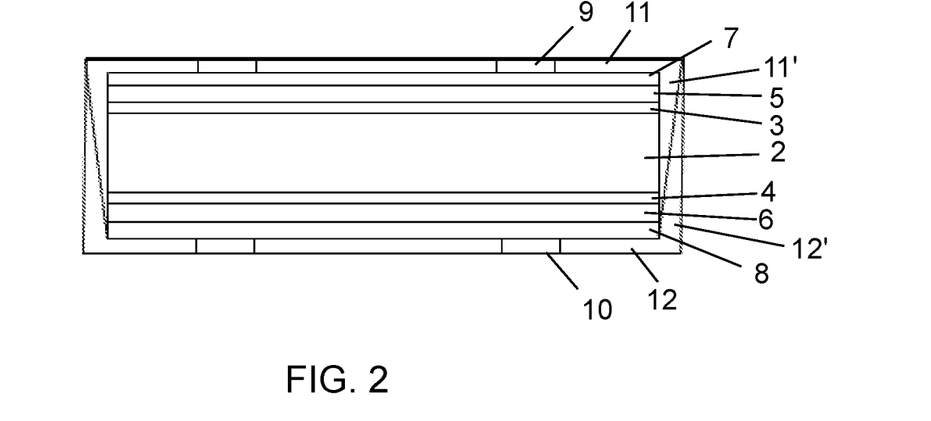

As can be seen in FIG. 2, an electrically non-conductive, transparent dielectric front face cover layer 11 is deposited with a PECVD deposition on the complete surface of the structure shown in FIG. 1 in a subsequent process step. The front face cover layer 11 thereby only deposits on the areas surrounding the contact layer grid structure 9, that is on the front face electrode layer 7, however, not or only minimally on the contact layer grid structure 9 itself.

An electrically non-conductive, transparent dielectric rear face cover layer 12 is furthermore deposited with a PECVD deposition on the rear face of the structure shown in FIG. 1. Thereby, the rear face cover layer 12 only deposits on the areas surrounding the contact layer grid structure 10, that is on the rear face electrode layer 8, however, not or only minimally on the contact layer grid structure 10 itself.

That means, an undisturbed layer growth of the front face and the rear face cover layer 11, 12 on the TCO of the front or the rear face electrode layer 7, 8 takes place, however, no or only very little growth is taking place on the silver paste fingers of the contact layer grid structures 9 or 10. One can call this a self-aligning PECVD deposition.

The formation of the front face cover layer 11 completely takes place over the entire front face, including the coverage 11' of the edges of the semiconductor substrate 2, and the formation of the rear face cover layer 12 takes place completely over the entire rear face, including the coverage 12' of the edges of the semiconductor substrate 2. The covers 11', 12' of the edges of the semiconductor substrate 2, for instance, run along wedge-shaped, starting from the front face 15 or the rear face 16 of the semiconductor substrate 2 and can be adjacent to each other or overlap each other.

Figure 3:
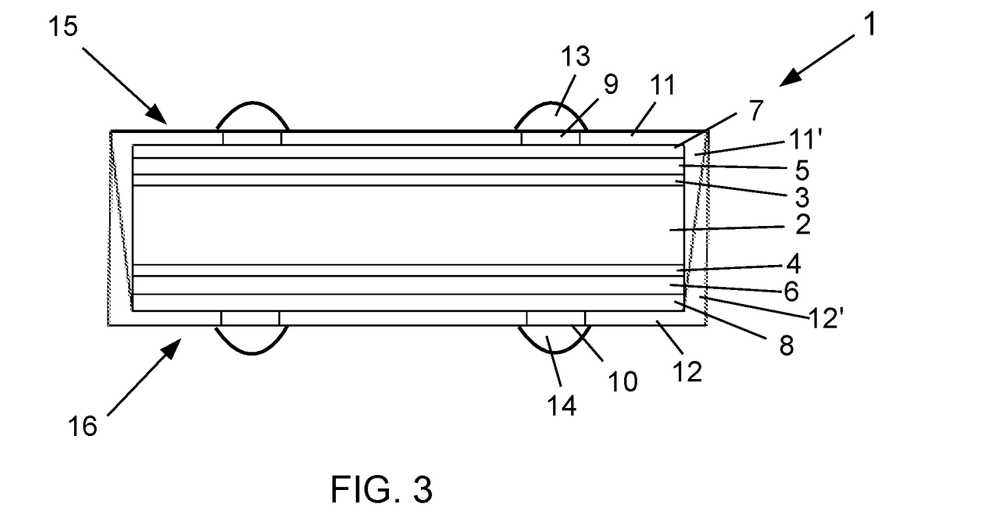
Figure 3A:
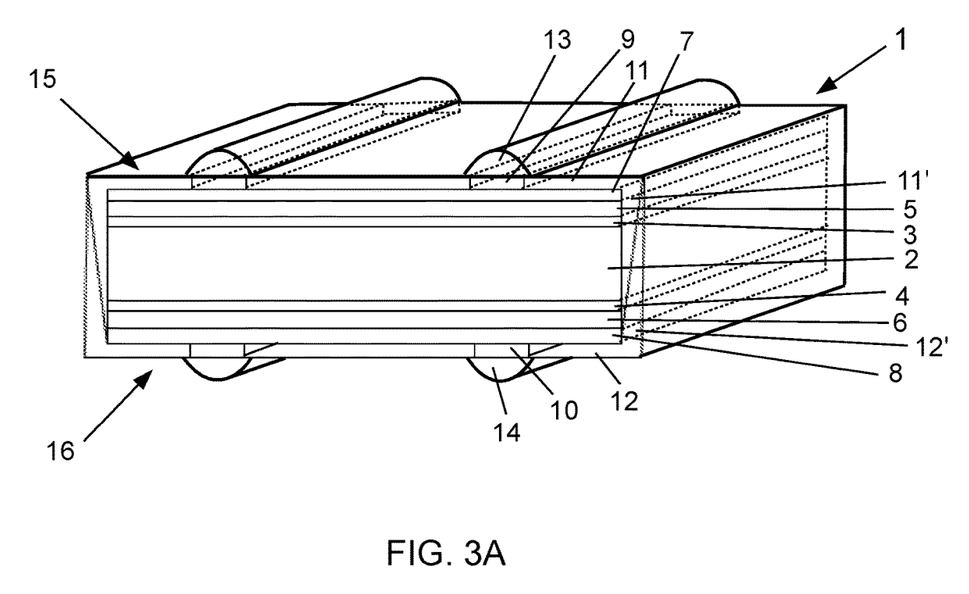
FIG. 3A shows a perspective view of FIG. 3.

As shown in FIG. 3, a frontal metallic contact thickness strengthening layer 13 is galvanically deposited on the frontal contact layer grid structure 9 after depositing the front face cover layer 11 using the material of the front face cover layer 11 as a galvanic masking layer without previous structuring and/or at least partial removal of the front face cover layer. As can also be seen in FIG. 3, a rearward metallic contact thickness strengthening layer 14 is galvanically deposited on the rearward contact layer grid structure 10 using the material of the rear face cover layer 12 as a galvanic masking layer without previous structuring and/or at least partial removal of the rear face cover layer 12. With the galvanization, the contact thickness strengthening layer 13 or 14 typically grows slightly sidewards beyond the contact layer grid structure 9 or 10 used as a seed layer.

The result is the solar cell 1 schematically depicted in cross section in FIG. 3 with a front face 15 provided for an incidence of light and a rear face 16 being located opposite the front face 15.

The solar cell 1 produced with the method described above can be electrically contacted equally well before and after the coating with the front and the rear face cover layer 11, 12. The sealing layer formed by the front and rear face cover layer 11, 12 remains entirely intact and does not need to be locally opened later in order to establish an electric contact between the frontal contact layer grid structure 9 and the associated contact thickness strengthening layer 13 as well as between the rearward contact layer grid structure 10 and the associated contact thickness strengthening layer 14.

For forming the front and rear face cover layer 11, 12, $SiO_x$ and/or $SiN_x$ layers are preferably used with the present invention, which are optically transparent and even enhance the anti-reflection coating of the solar cell 1 when choosing ideal layer thicknesses. Due to the double ARC function, for example by TCO and $SiO_2$, the short-circuit current $I_{SC}$ and the conversion efficiency ETA of the solar cell are thus increased.

The steps for sealing the TCO layers of the method according to the invention can generally also be applied with thin film modules.

Figure 4:
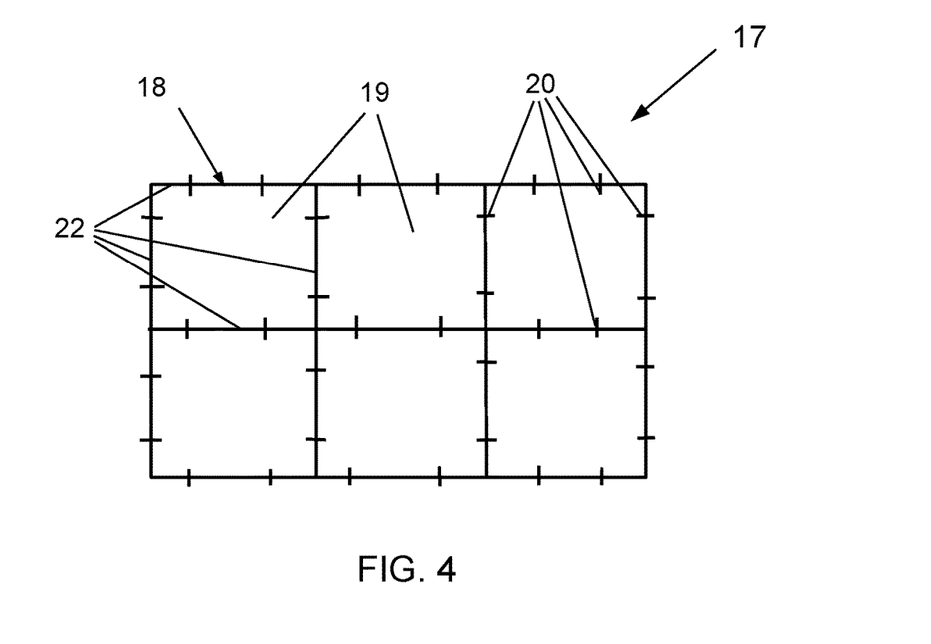
FIG. 4 schematically shows a top view on an embodiment of a substrate carrier according to the invention.

FIG. 4 schematically shows a top view of an embodiment of a substrate carrier 17 according to the invention. The substrate carrier 17 is a so-called wafer carrier, which comprises a carrier grid 18 with several carrier nests 19 arranged in rows and columns. Each carrier nest 19 is hereby surrounded by frame beams 22 forming a nest frame. The carrier nests 19 respectively serve for receiving a semiconductor substrate 2 over the surface.

Figure 5:
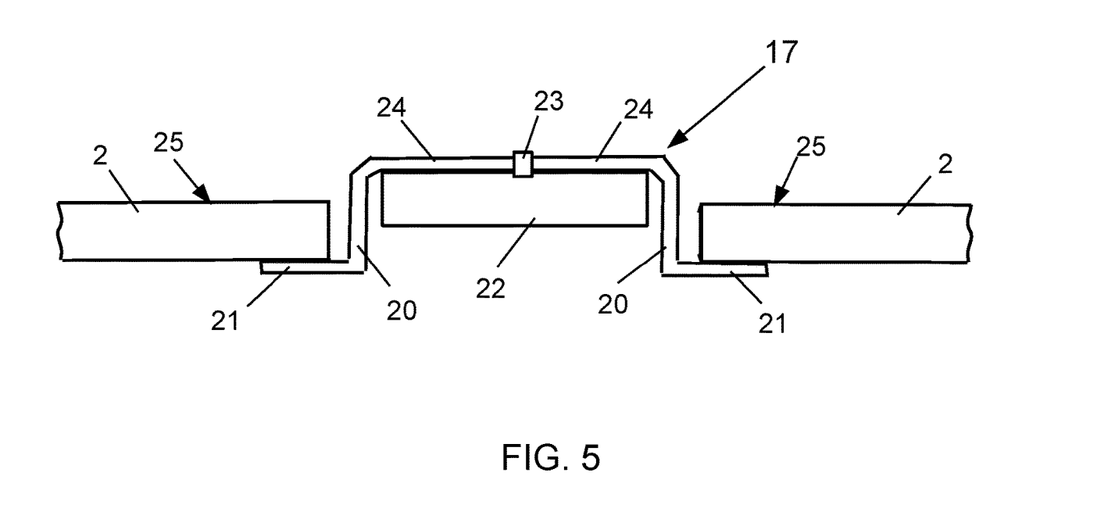
FIG. 5 schematically shows a cross section of a frame beam with retaining brackets of a substrate according to the invention, wherein, as schematically indicated, two semiconductor substrates lie on retaining pins of the retaining bracket.

Retaining hooks 20 fixed on or integrally connected to the frame beam 22 protrude down into the carrier nest 19 from all sides of the nest frame. As can be seen in FIG. 5, a retaining pin 21, which is parallely aligned to a surface 25 of the semiconductor substrate 2 to be received, is thereby is provided on each retaining hook 20. The semiconductor substrate 2 is laid into the carrier nest 19 in such a way that it is held on each of the retaining hooks 20 running from the frame beams 22 surrounding the carrier nest 19, wherein the semiconductor substrate 2 lies on the retaining pins 21 respectively.

As can be seen in FIG. 4, the carrier grid 18 comprises several adjacent carrier nests 19 being respectively separated by a frame beam 22 of the nest frame. With these carrier nests 19, retaining brackets 24 with at least one retaining element 23 are respectively fixed in such a way on the frame beams 22 that the retaining hooks 20 located on the retaining brackets 24 protrude into one of the carrier nests 19 each with the retaining pins 21 provided thereon.

The invention claimed is:

1. A method of producing a solar cell with a heterojunction, a front face for incident light and a rear face opposite the front face, the method comprising the following steps:
    providing a crystalline semiconductor substrate of a first conductivity type;
    forming at least one amorphous, nanocrystalline and/or microcrystalline semiconductor layer or layer sequence on a frontal surface of the semiconductor substrate, either by forming a front face emitter of a second conductivity type opposite the first conductivity type or by forming a front face surface field layer of the first conductivity type;

forming at least one second amorphous, nanocrystalline and/or microcrystalline semiconductor layer or layer sequence on a rearward surface of the semiconductor substrate, either by forming a rear face surface field layer of the first conductivity type or by forming a rear face emitter of the second conductivity type;

forming at least one electrically conductive, transparent front face electrode layer on the front face emitter or the front face surface field layer, the at least one electronically conductive, transparent front face electrode layer being a TCO-layer, and forming at least one electrically conductive, transparent rear face electrode layer on the rear face surface field layer or the rear face emitter;

forming a frontal metallic contact layer grid structure for electrically contacting the front face emitter or the front face surface field layer;

choosing a material being predominantly of silver or copper for forming the front metallic contact layer grid structure and printing the frontal metallic contact layer grid structure as a finger structure using a paste;

subsequent to forming the frontal metallic contact layer grid structure, depositing, by surface selective frontal plasma-enhanced chemical vapor deposition (PECVD) or hotwire CVD, an electrically non-conductive, transparent dielectric front face cover layer without using a mask, and thereby depositing the front face cover layer with such a thickness that the front face cover layer, directly after its layer deposition without additional heat treatment and/or chemical treatment, forms a closed layer only on areas surrounding the frontal contact layer grid structure, but not on the frontal contact layer grid structure;

using at least one $SiO_x$-, $SiN_x$-, $SiO_xN_y$-layer or a layer or sequence consisting of a combination of at least two of the aforementioned materials for depositing the front face cover layer;

using silane and/or tetramethyksilane and silane for depositing the front face cover layer, and depositing the front face cover layer in a temperature range between 50° C. and 250° C.; and forming a rear face metallization on the rear face electrode layer.

2. The method according to claim 1, wherein the step of forming the rear face metallization comprises the following steps:

forming a rearward metallic contact layer grid structure for electrically contacting the rear face emitter or the rear face surface field layer;

subsequently depositing, by surface selective rearward PECVD, an electrically non-conductive, transparent dielectric rear face cover layer;

thereby depositing the rear face cover layer with such a thickness that the rear face cover layer, directly after its layer deposition without additional heat and/or chemical treatment, forms a closed layer only on areas surrounding the rear contact layer grid structure, but not on the rearward contact layer grid structure.

3. The method according to claim 2, which comprises carrying out one or both of the following steps:

galvanically depositing at least one frontal metallic contact thickness strengthening layer on the frontal contact layer grid structure using a material of the front face cover layer as a galvanic masking layer without previous strengthening and/or at least partial removal of the front face cover layer; and galvanically depositing at least one rearward metallic contact thickness strengthening layer on the rearward contact layer grid structure using a material of the rear face cover layer as a galvanic masking layer without previous structuring and/or at least partial removal of the rear face cover layer.

4. The method according to claim 2, which comprises strengthening by tempering the frontal metallic contact layer grid structure before depositing the front face cover layer and/or strengthening by tempering the rearward metallic contact layer grid structure before depositing the rear face cover layer.

5. The method according to claim 2, which comprises forming the front face cover layer and the rear face cover layer immediately one after another in the same coating device in a single processing step.

6. The method according to claim 2, wherein the PECVD deposition for producing the transparent dielectric front face cover layer and/or the transparent dielectric rear face cover layer is selected from the group of deposition processes consisting of a microwave-based PECVD deposition, an HF-PECVD deposition, a VHF-PECVD deposition and a PECVD deposition using an expanding thermal plasma (ETP) source.

7. The method according to claim 2, which comprises depositing the front face cover layer and/or the rear face cover layer by forming at least one layer selected from the group consisting of $SiO_x$, $SiN_x$, $SiO_xN_y$, $AlO_x$, $AlN_x$ and $TiO_2$, at least one electrically conductive oxide or a layer or layer sequence consisting of a combination of at least two of the aforementioned materials.

8. The method according to claim 7, which comprises using at least one $SiO_x$ layer for depositing the front face cover layer and/or using at least one $SiN_x$ layer for depositing the rear face cover layer.

9. The method according to claim 7, which comprises at least partially doping the front face cover layer and/or the rear face cover layer during a deposition thereof.

10. The method according to claim 2, which comprises depositing one or each of the front face cover layer and the rear face cover layer within a temperature range between 50° C. and 250° C.

11. The method according to claim 2, which comprises forming the frontal and/or the rearward contact layer grid structure and the at least one frontal and/or the at least one rearward contact thickness strengthening layer with a material selected from the group consisting of at least one electrically conductive oxide, at least one metal, at least one metal alloy and a combination of at least two thereof.

12. The method according to claim 2, which comprises forming the frontal and/or the rearward contact layer grid structure and the at least one frontal and/or at least one rearward contact thickness strengthening layer, from a material that mainly consists of silver or copper.

13. The method according to claim 2, which comprises printing the frontal contact layer grid structure and/or the rearward contact layer grid structure as a finger structure using a paste.

14. The method according to claim 1, which comprises forming the front face electrode layer and/or the rear face electrode layer with a transparent, electrically conductive oxide.

15. The method according to claim 1, which comprises forming the front face cover layer completely over an entire front face, including covering edges of the semiconductor substrate and/or forming the rear face cover layer completely over an entire rear face, including covering the edges of the semiconductor substrate.

16. A solar cell, produced by the method according to claim 1.

* * * * *